United States Patent
Homola et al.

(10) Patent No.: US 10,079,214 B2
(45) Date of Patent: Sep. 18, 2018

(54) POWER SEMICONDUCTOR DEVICE

(71) Applicant: ABB Schweiz AG, Baden (CH)

(72) Inventors: Jaroslav Homola, Kladno (CZ); Ladislav Dort, Prague (CZ); Ladislav Radvan, Benesov (CZ)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 15/216,182

(22) Filed: Jul. 21, 2016

(65) Prior Publication Data

US 2016/0329286 A1 Nov. 10, 2016

Related U.S. Application Data

(63) Continuation of application No. PCT/EP2014/078301, filed on Dec. 17, 2014.

(30) Foreign Application Priority Data

Jan. 21, 2014 (EP) ..................................... 14151989

(51) Int. Cl.
*H01L 23/00* (2006.01)
*H01L 23/051* (2006.01)
(Continued)

(52) U.S. Cl.
CPC .......... *H01L 23/562* (2013.01); *H01L 23/051* (2013.01); *H01L 23/10* (2013.01);
(Continued)

(58) Field of Classification Search
CPC ............................. H01L 23/00; H01L 23/051
See application file for complete search history.

(56) References Cited

U.S. PATENT DOCUMENTS 4,099,201 A * 7/1978 Mueller ................ H01L 23/051
257/683
5,519,231 A 5/1996 Nakashima et al.

FOREIGN PATENT DOCUMENTS

DE 1951128 A1 4/1971
DE 3006023 A1 9/1980
(Continued)

OTHER PUBLICATIONS

Title: JPH0214572A Machine Translation Translated date: Apr. 17, 2017 Publisher: European Patent Office Pertinent Page: pp. 1-9.*
(Continued)

*Primary Examiner* — Olik Chaudhuri
*Assistant Examiner* — Lamont Koo
(74) *Attorney, Agent, or Firm* — J. Bruce Schelkopf; Taft Stettinius & Hollister LLP

(57) ABSTRACT

A power semiconductor device is disclosed having a power semiconductor element with an upper and lower side, the upper side being located opposite to the lower side; a first and second electrode, and a housing, wherein the power semiconductor element is arranged between the first and second electrode such, that the upper side comprises a first contact portion being in contact with the first electrode and a first free portion not being in contact with the first electrode, and wherein the lower side at least comprises a second contact portion being in contact with the second electrode, and wherein a channel is provided fluidly connecting at least a part of the first free portion with a predetermined degassing point of the housing for guiding an overpressure, which overpressure results from plasma and/or gas occurring in a failure mode, from the first free portion to the predetermined degassing point.

20 Claims, 2 Drawing Sheets

(51) Int. Cl.
*H01L 23/10* (2006.01)
*H01L 23/62* (2006.01)

(52) U.S. Cl.
CPC ...... *H01L 23/62* (2013.01); *H01L 2924/0002* (2013.01); *H01L 2924/1203* (2013.01); *H01L 2924/1301* (2013.01)

(56) References Cited

FOREIGN PATENT DOCUMENTS

| | | |
|---|---|---|
| DE | 4321053 A1 | 1/1994 |
| JP | H0214572 * | 1/1990 |
| JP | 05-304179 A | 11/1993 |

OTHER PUBLICATIONS

European Patent Office, International Search Report & Written Opinion issued in corresponding Application No. PCT/EP2014/078301, dated Mar. 6, 2015, 9 pp.
European Patent Office, International Preliminary Report on Patentability issued in corresponding Application No. PCT/EP2014/078301, dated Mar. 31, 2016, 10 pp.
European Patent Office, Extended Search Report issued in corresponding Application No. 14151989.2, dated Jul. 2, 2014, 6 pp.

* cited by examiner

POWER SEMICONDUCTOR DEVICE

TECHNICAL FIELD

The present invention relates to power semiconductor devices. The present invention particularly refers to power semiconductor devices having an improved failure mode during operation.

BACKGROUND ART

Housings of high power semiconductor devices usually comprise a cathode and an anode. The respective electrodes are in contact with the semiconductor element which is placed between the electrodes and enable the current flow through the high power semiconductor device. The cathode and anode electrodes may be connected to a ceramic ring that enables electrical isolation of the cathode and anode electrodes from each other and which allows an air tight enclosure for preventing an inflow of oxygen to the semiconductor element. The cathode and anode electrodes, the ceramic ring and potentially further parts such as flanges thus create a closed space of housing in which the semiconductor element is placed. The closed space of the housing of a high power semiconductor device is usually filled with an inert gas.

In JP 05304179 in FIG. 8 and par. [0044] a ring shaped groove filled by a component 41 for adhesion, such as silicone rubber and polyimide, whereby there is no fluidly connection of at least a part of the first free portion (at the edge of the element) with a predetermined degassing point 31, 32, 33) of the housing for guiding an overpressure from the first free portion to the predetermined degassing 31, 32, 33 point. During production of semiconductor device of JP 05304179 when placing the semiconductor base substance 2 on the first electrode plate 51 air could be enclosed between the holes 31, 32, 33, whereby these holes 31, 32, 33 enable the air to exhaust, see par. [0077] in connection with FIG. 8.

Also U.S. Pat. No. 5,519,231 shows in FIG. 4 holes, 20b, 20c, 20d, 20e for exhausting air or gas during production (see col. 11, lines 46-57). Additionally, DE 43 210 53 A1 discloses in FIG. 2 also holes 31c, 31d for exhausting air or gas during production (see col. 6, lines 6-11; col. 5, lines 19-31; col. 19, line 50-col. 20, line 3).

It is known for power semiconductor devices that under circumstances they may fall into a failure mode during operation, when a point of breakdown was created in the semiconductor element and subsequently a high current density flows through this point of breakdown. Without providing respective counter measures, these kinds of failures may lead to the formation of hot plasma and/or gas inside the housing of the high power semiconductor device, whereby plasma is defined as ionized gas. Such failures may thus lead to a damage of the power semiconductor device.

DISCLOSURE OF INVENTION

It is an object of the present invention to provide a power semiconductor device which provides an improved failure mode during operation of the power semiconductor device. It is particularly an object of the present invention to provide a power semiconductor device which reduces the danger of significant destructions caused by a failure during operation of the power semiconductor device.

These objects are at least partly solved by a power semiconductor device according to independent claim 1. Advantageous embodiments are given in the dependent claims.

In particular, the present invention provides a power semiconductor device, comprising a power semiconductor element with an upper side and with a lower side, the upper side being located opposite to the lower side; a first electrode and a second electrode, and a housing, wherein the power semiconductor element is arranged between the first electrode and the second electrode such, that the upper side comprises a first contact portion being in contact with the first electrode and a first free portion not being in contact with the first electrode, and wherein the lower side at least comprises a second contact portion being in contact with the second electrode, and wherein a channel is provided fluidly connecting at least a part of the first free portion with a predetermined degassing point of the housing for guiding an overpressure, which overpressure results from plasma and/or gas occurring in a failure mode during operation of the power semiconductor device, from the first free portion to the predetermined degassing point.

A power semiconductor device like described above provides an improved failure mode during operation of the power semiconductor device. In particular, the power semiconductor device like described above may significantly reduce the danger of an explosion occurring due to an overpressure created inside the housing in case a failure occurs during operation of the semiconductor device.

A power semiconductor device according to the present invention shall particularly be a device which is based on a semiconductor element and which may preferably be used as a switch or rectifier in power electronics. Non-limiting examples for power semiconductor devices comprise inter alia gate turn-off thyristors (GTO), and according to the invention particularly preferred diodes, thyristors and especially those who are at least partly encapsulated in ceramic housings.

The power semiconductor device comprises a power semiconductor element with an upper side and with a lower side, the upper side being located opposite to the lower side. Such a power semiconductor element is widely known in the art and may be formed as appropriate for the specific application. In detail and for the non-limiting example of a PCT, the semiconductor element may be formed of a semiconductor, such as silicium, which comprises alternating layers (P-N-P-N). Such structures, or such semiconductor devices, respectively, are generally known in the art and will thus not be described in detail.

The power semiconductor device further comprises a first electrode and a second electrode. These electrodes may generally be formed from a material as it is known in the art. For example, the electrodes may be formed from copper. The first electrode is arranged in vicinity to the upper side of the semiconductor element, whereas the second electrode is located in vicinity to the lower side of the semiconductor element. In detail, the power semiconductor element is arranged between the first electrode and the second electrode such, that the upper side comprises a first contact portion being in contact with the first electrode and a first free portion not being in contact with the first electrode. Correspondingly, the lower side comprises a second contact portion being in contact with the second electrode and optionally a second free portion not being in contact with the second electrode.

Further, a housing is provided in order to airtightly enclose the semiconductor element. This may be advantageous in order to ensure that the power semiconductor element works properly. The housing may be formed by a ceramic shell which at least partly is located adjacent to the electrodes. Further, a flange may be provided which connects the electrodes with the insulator in order to close the housing. Thus, the electrodes may as well form part of the housing.

In case the power semiconductor element falls in a failure mode during operation of the power semiconductor device, there is the danger of a plasma to be formed on top of the free portion particularly of the upper side of the semiconductor element. This may in an especially intense manner be the case insofar PN-junctions are located at this free portion: In this case, an overpressure may occur which potentially has the danger of negatively influencing the parts of the semiconductor device like will be described down below.

In order to reduce the danger based on a plasma to be formed, a channel is provided which fluidly connects at least a part of the first free portion, optionally via a volume provided in direct vicinity to the free portion, with a predetermined degassing point of the housing. The channel is thus designed for guiding an overpressure generated at the surface of the first free portion, or the free perimeter of the power semiconductor element, respectively, from the first free portion to the predetermined degassing point. In the following, the invention is described by using one channel. However, it is clear for one skilled in the art that more than one channel may be present connecting respective positions with all the same or a plurality of predetermined degassing points.

A fluid connection shall thereby particularly mean a connection through which a liquid such as a gas may be guided and thus a connection which is permeable for a fluid and particularly for a gas.

Further, a predetermined degassing point may particularly be a distinct position and/or a distinct means at which an overpressure may leave the power semiconductor device and particularly the housing of the power semiconductor device. In particular, the predetermined degassing point may be a location which is closed in a normal working/operation mode but which may be gas permeable at predetermined conditions arising at a failure. Such conditions may comprise an overpressure or elevated temperatures, which arise in case a plasma and/or gas is formed at a failure. The respective predetermined degassing point may for example be the flange which is designed such, that it airtightly closes the housing but may be opened or locally damaged and thus gas permeable due to the conditions occurring at a failure.

As a result of the above, in case the power semiconductor element falls in a failure mode or has a failure during operation of the power semiconductor device, an overpressure which may result from a plasma and/or gas to be formed may be guided through the channel to the predetermined degassing point and may thus be guided to the outside of the power semiconductor device, or to the outside of the housing, respectively. The critical failure mode may occur when a point of breakdown was created at the perimeter of the semiconductor element inside the housing of high power semiconductor device and subsequently a high current density flows through the point.

Therefore, as the overpressure is guided to the outside of the housing, the power semiconductor device as described above provides an especially advantageous concept of preventing a high power semiconductor device from explosion in a failure mode. Due to enabling a very controlled escape of the hot plasma and/or gas with high pressure, which is potentially created in the failure mode, from the housing of the high power semiconductor device.

It may thus be ensured that no high pressures and thus energy potentially damaging the power semiconductor device stays in the housing so that an explosion is securely avoided. Apart from that the danger that an overpressure stays in the housing and damages the power semiconductor device at a later stage is avoided. Correspondingly, it may be avoided that for example a person or a device which handles the power semiconductor device during service work, for example, is injured or damaged. Therefore, the danger presented by a power semiconductor device is significantly reduced.

At the same time, in case an explosion takes place, mostly the overpressure flows out of the housing at no predetermined position because of which the danger of damaging surrounding parts, such as heat sinks, cannot be avoided. According to the present invention, however, there may be a predetermined position for guiding the overpressure out of the housing. As a result, the arrangement and the position of the predetermined degassing position may be chosen such, that no danger or only a significantly reduced danger is presented by the power semiconductor device. Therefore, even in the case of a failure mode being accompanied with an extreme overpressure formation it may securely be avoided or at least significantly reduced that the hot plasma and/or gas being guided to the outside of the housing damages further parts of the arrangement, such as for example heat sinks, or another parts of an equipment in which the high power semiconductor device was placed.

As a result, it is effectively addressed to the problem according to which explosions of semiconductor devices can cause damage to equipment or injuries to personnel and in contrast thereto, these problems are securely avoided or at least significantly reduced.

The solution according to the present invention further has significant advantages over the solutions according to the prior art. In detail, high power semiconductor devices usually solve the above named issue by comprising metal or plastic parts inside the housings of high power semiconductor devices to prevent hot plasma and/or gas from reaching a ceramic ring of the housing or flanges and further by making the housing of high power semiconductor device more resistant to high pressure inside. These measures may help to prevent explosion up to some level of energy and up to some level of pressure cumulated inside of the housing, only. Therefore, in case the overpressure exceeds a predefined value, these measures have only limited effects. This should under circumstances be especially prevented due to the fact that in case the increased level of the critical energy or critical pressure for destruction of the housing is exceeded in some cases, then the explosion will most likely be especially dangerous.

Further, when using the above measures according to the prior art, the pressure stays inside the housing, because of which there is a danger of a malfunction and an undefined degassing in later manipulation stage with the failed device. These disadvantages are addressed to by using a solution according to the present invention, like it is described above.

To summarize, a power semiconductor device according to the present invention may enable a controlled escape of hot plasma and/or gas with high pressure, created in a critical failure mode, from the housing and at the same time may prevent the hot plasma and/or gas from damaging the heat-sinks or further parts of equipment in which the semiconductor device was placed. The power semiconductor device is thus at least partly prevented from explosion in the failure mode, safety of personnel manipulating with failed devices is improved, and the danger of damaging parts in the vicinity of the power semiconductor device is reduced.

According to an embodiment, the predetermined degassing point is a predetermined breaking point. Especially a predetermined breaking point is suitable in a very advantageous manner to allow a degassing to take place at a very well defined overpressure inside the housing. Further, the above-named solution is very well suitable for adapting the degassing point, or the defined set value of degassing to a required value. Therefore, according to this embodiment, an especially broad application range may be provided. Apart from that and with respect to the predetermined breaking point, this may provide an especially cost-saving solution. As a result, a secure failure mode may be accompanied with a smallest possible costs and damage.

In case the predetermined degassing position is a predetermined breaking point, the latter may be realized by a defined weakened portion of the material, such as of the flange, for example designed as a defined thinned portion or thinned structure, respectively. This is an especially cost-saving measure and may be implemented in a known producing process without significant problems.

According to a further embodiment, the predetermined degassing point is provided in a flange, wherein the flange connects the first electrode with a further part of the housing, such as with an insulation part. This embodiment is especially cost-saving to produce. In detail, the further parts of the housing such as the insulation part, for example a ceramic insulator, or ceramic ring, respectively, may be designed in an essentially conventional manner so that, if at all, only the flange has to be adapted. Apart from that, a high adaptability may be reached due to the fact that the flange may be produced in a required manner without significant costs. Further, the flange may be easily provided with a predetermined degassing point.

According to a further embodiment, an edging is provided for enclosing free portion, or a volume above the latter, respectively. For example, the edging may be placed, such as squeezed, between the first and the second electrode and may be formed from an isolating material in order not to negatively influence the working behavior of the electrodes, or the power semiconductor device, respectively. This embodiment allows to enclose, or encapsulate, respectively, the free portion such, that a kind of inner space is formed above the free portion, which inner space is only connected to the channel. In other words, in case a plasma and/or gas is formed due to a failure, the only way for the plasma and/or gas to expand is to through the channel and thus to the predetermined degassing point. As a result, it may be avoided that the overpressure reaches non-desired parts of the housing which may lead to a damage of these parts. Therefore, the edging may be formed more stable compared to the predetermined degassing point, or it may for example be formed from an elastic material. The formed inner space is advantageously located above locations being especially susceptible for a failure, such as above PN-junctions.

According to a further embodiment, a portion of the electrode facing a free portion of the upper side or of the lower side is arranged in a two-part form. In fact the two-part from may be arranged such, that only a small portion of the respective electrode may be arranged separately. The small potion for example may be arranged ring-like. It may be formed from the same material compared to the main part of the electrode. According to this embodiment, the manufacturing process may be significantly enhanced due to the fact that a cleaning process may be significantly enhanced in case the main part of the electrode may be provided firstly and after a cleaning process of a volume limited by the electrode a smaller portion may be introduced.

According to a further embodiment, a gas guiding device is provided in vicinity to the predetermined degassing point. According to this embodiment, the gas stream of hot plasma and/or gas, for example, may be guided to a position where a danger of damaging further parts is especially significantly reduced. This allows a very compact arrangement of the power semiconductor device with further parts and further allows the danger of damaging further parts based on a failure mode to be especially effectively reduced. A location in vicinity to the degassing point shall thereby particularly mean that the gas guiding device is positioned such, that a gas leaving the degassing point and thus the housing may be guided to a specified direction through the gas guiding device.

The gas guiding device may thereby be a polymer ring which is located in vicinity to the degassing device. This allows a very cost-saving and stable arrangement.

According to a further embodiment, the channel is formed as a path through the electrode. This embodiment may allow an especially easy and cost-saving measure in order to provide the channel. In fact, the electrode may be provided with a drill hole, for example, thus providing the respective channel. Therefore, no additional parts have to be introduced when manufacturing the power semiconductor device, but the channel has to be provided in parts being present in any case, which allows realizing the arrangement according to the invention without significant problems and with one simple additional step.

BRIEF DESCRIPTION OF DRAWINGS

These and other aspects of the invention will be apparent from and elucidated with reference to the embodiments described hereinafter.

In the drawings.

DETAILED DESCRIPTION OF THE INVENTION

Figure 1:
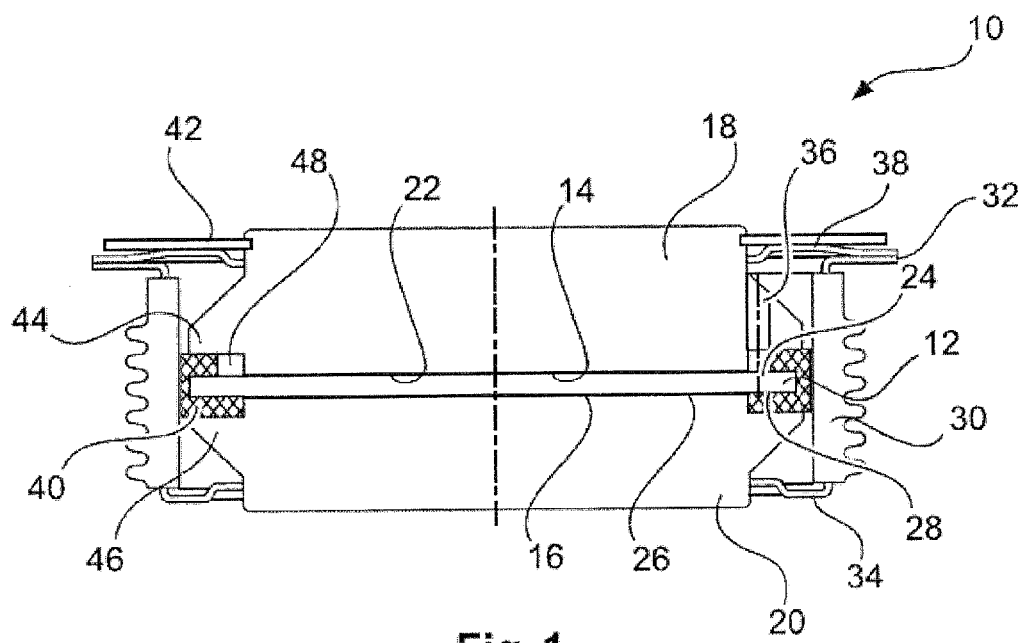
FIG. 1 shows an exemplary embodiment of a power semiconductor device according to the invention.

Reference will now be made in detail to various embodiments, one or more examples of which are illustrated in each figure. Each example is provided by way of explanation and is not meant as a limitation. For example, features illustrated or described as part of one embodiment can be used on or in conjunction with other embodiments to yield yet further embodiments. It is intended that the present disclosure includes such modifications and variations.

Within the following description of the drawings, the same reference numbers refer to the same components. Generally, only the differences with respect to the individual embodiments are described. When several identical items or parts appear in a figure, not all of the parts have reference numerals in order to simplify the appearance.

In FIG. 1, a cross-section of an embodiment of a power semiconductor device 10 according to the present invention is shown. The power semiconductor device 10 may be a power GTO or IGCT , diode or a thyristor, for example.

The power semiconductor device 10 comprises a power semiconductor element 12 with an upper side 14 and with a lower side 16, the upper side 14 being located opposite to the lower side 16. the power semiconductor element 12 is arranged between a first electrode 18 and a second electrode 20 such, that the upper side 14 comprises a first contact portion 22 being in contact with the first electrode 18 and a first free portion 24 not being in contact with the first electrode 18, and wherein the lower side 16 at least comprises a second contact 26 portion being in contact with the second electrode 20 and a free portion 28 not being in contact with the second electrode 20.

Further, a housing is provided which airtigthly encloses the power semiconductor element 12. The housing comprises the electrodes 18, 20, a ceramic ring 30 as well as flanges 32, 34 connecting the electrodes 18, 20 and the ceramic ring 30. In other words, the electrodes 18, 20 of the housing and the flanges 32, 34 and the ceramic ring 30 form a closed space of housing of the high power semiconductor device 10 in which the power semiconductor element 12 is placed.

It may further be seen that a channel 36 is provided fluidly connecting at least a part of the first free portion 24 with a predetermined degassing point 38 of the housing for guiding an overpressure from the first free portion 24 to the predetermined degassing point 38. The channel 36 is formed as a path through the first electrode 18.

The predetermined degassing point 38 may be the flange 32, as such, or it may be a predetermined breaking point, such as a defined weakened portion of the housing and in particular of the flange 32. Generally, the predetermined degassing point 38 may be a part of the housing which is designed such, that an overpressure which may occur during a failure mode during operation of the power semiconductor device may leave the housing through this point. Therefore, in contrast to the prior art, the housing is not as strong as possible but at least a defined point or portion at which an overpressure over a defined value and optionally with a defined temperature may leave the housing. In detail, the predetermined degassing point 38 is provided in a flange 32, wherein the flange 32 connects the electrode 18 with a further part of the housing, in particular with the ceramic ring 30.

FIG. 1 further shows that a preferably elastic isolating material, for example silicon rubber, such as in the form of a ring, is provided. The isolating material forms an edging 40 and encloses the free portion 24. It can be seen that the edging 40 is placed between the first and the second electrode and surrounds and encompasses the power semiconductor element 12. This embodiment allows to enclose, or encapsulate, respectively, the free portion 24 such, that a kind of inner space 48 is formed above the free portion 24, which inner space is only connected to the channel 36. The isolating material may this have an isolating strength which is strong enough to permit a negative influence from the respective electrodes 18, 20.

In order to safely guide degassed atmosphere away from the predetermined degassing point 38, a gas guiding device 42 is provided in vicinity to the predetermined degassing point 38, wherein according to FIG. 1, the gas guiding device 42 is a polymer ring. The gas guiding device 42, such as the polymeric ring, such as made from PTFE, may be fixed into a groove in the first electrode 18.

In more detail, the electrodes 18, 20 comprise a part which is in direct contact with the power semiconductor device 12 and further comprise extensions 44, 46 that are located above the free parts 24, 28 of semiconductor element and spaced apart and thus not in direct contact with the power semiconductor device 12, or the free parts 24, 28 of the latter, respectively. The channel 36 may then be located in these extensions 44, 46.

In failure mode during operation of the power semiconductor device when a point of breakdown was created in the semiconductor element 12 at a critical spot for explosion, that is at the perimeter of the free portion 24 and thus inside the protective inner space 48 and subsequently a high current density flows through this point of breakdown, the generated hot plasma and/or gas with high pressure escape from the protective inner space 48 through passage 36, escape from the predetermined breaking point 38, such as burn a small hole into flange 32, and escape from the closed space of housing. The protective PTFE ring 42 prevents hot plasma and/or gas from making damage to a heat-sink, for example. No energy that could cause an explosion of high power semiconductor device stays inside the housing.

Figure 2:
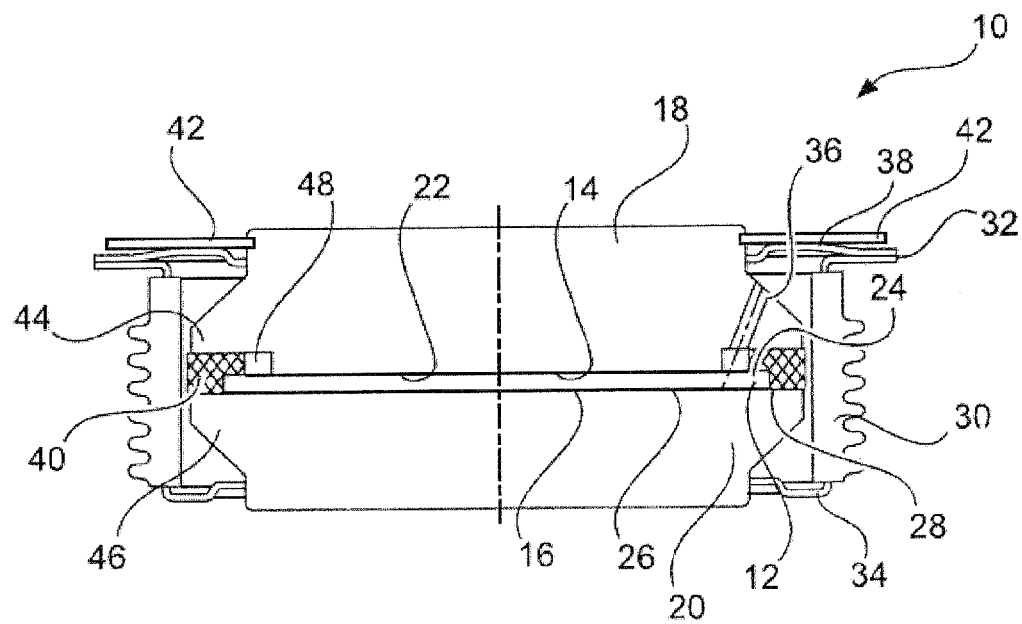
FIG. 2 shows an exemplary further embodiment of a power semiconductor device according to the invention.

FIG. 2 shows a further embodiment of a power semiconductor device 10 according to the invention. The embodiment of FIG. 2 is based on the embodiment described with regard to FIG. 1 so that the same numerals refer to the same or comparable parts. With respect to these, it is referred to the above description of FIG. 1. In FIG. 2, the channel 36 has a deviating form and is designed in a sloped manner. This embodiment shall thus show that the form and/or geometry of the channel 36 is essentially free and may be adapted to the desired application without problems. Further, It may be seen that the free portion 24 not being in contact with the electrode 18 can be also on one side of the power semiconductor element 12 only.

Figure 3:
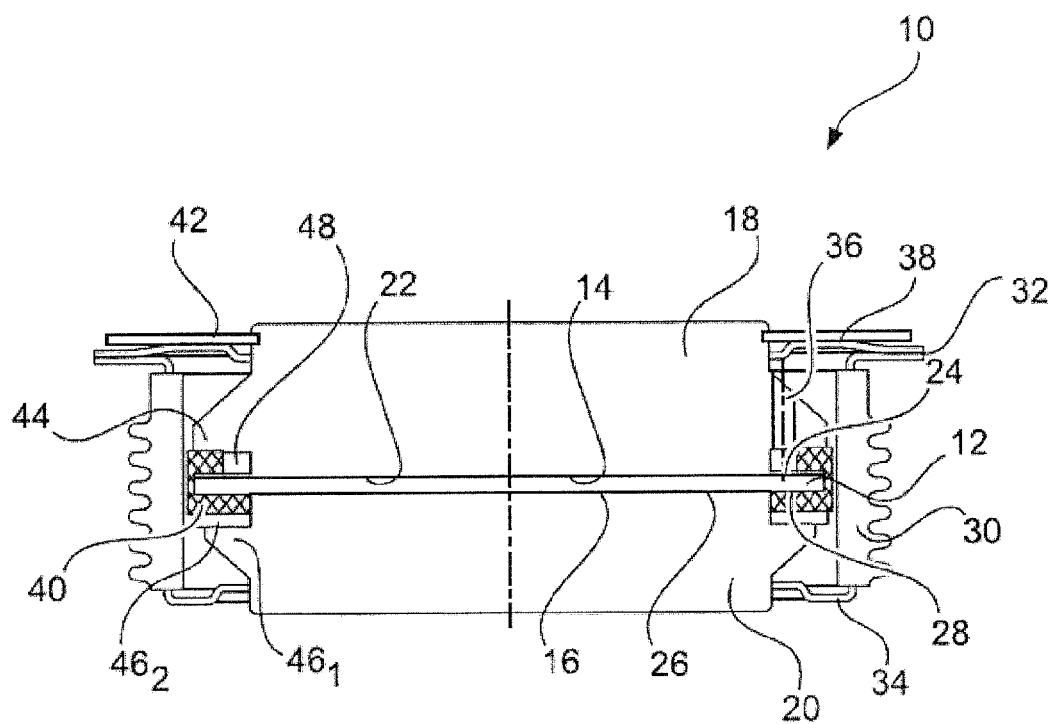
FIG. 3 shows an exemplary further embodiment of a power semiconductor device according to the invention.

It may be demanding to clean properly the space below the extension 44, 46 of the electrodes 18, 20 through the narrow opening between the extension 44, 46 and the ceramic ring 30 during manufacturing process. A solution of this issue is shown in FIG. 3. Again, the embodiment of FIG. 3 is based on the embodiment described with regard to FIGS. 1 and 2 so that the same numerals refer to the same or comparable parts. With respect to these, it is referred to the above description of FIG. 1.

According to FIG. 3, the electrode 20 of the housing comprises an extension 46 made of two parts, a first part $46_1$ and a second part $46_2$. The second part $46_2$ has a form of a ring with inner diameter smaller then outer diameter of the electrode 20. The part is pre-heated to increase its size and inserted to its position after the housing with the smaller extension part has been cleaned. While the invention has been illustrated and described in detail in the drawings and foregoing description, such illustration and description are to be considered illustrative or exemplary and not restrictive; the invention is not limited to the disclosed embodiments. Other variations to be disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting scope.

REFERENCE SIGNS LIST 10 power semiconductor device
12 power semiconductor element
14 upper side
16 lower side
18 first electrode
20 second electrode
22 contact portion
24 free portion 26 contact portion
28 free portion
30 ceramic ring
32 flange
34 flange
36 channel
38 predetermined degassing point
40 edging
42 gas guiding device
44 extension
46 extension
$46_1$ first part of the extension
$46_2$ second part of the extension
48 protective inner space

The invention claimed is:

1. A Power semiconductor device, comprising:
a power semiconductor element with an upper side and with a lower side, the upper side being located opposite to the lower side;
a first electrode and a second electrode, and
a housing, wherein
the power semiconductor element is arranged between the first electrode and the second electrode such that the upper side comprises a first contact portion being in contact with the first electrode and a first free portion not being in contact with the first electrode, the first free portion located at a perimeter of the upper side, and wherein the lower side at least comprises a second contact portion being in contact with the second electrode, and wherein
a channel is provided fluidly connecting at least a part of the first free portion with a predetermined degassing point of the housing for guiding an overpressure, which overpressure results from at least one of plasma and gas occurring in a failure mode during operation of the power semiconductor device, from the first free portion to the predetermined degassing point;
wherein the predetermined degassing point is realized by a defined weakened portion of the housing, which degassing point is airtightly closed in normal operation mode and gas permeable in failure mode,
wherein the first electrode comprises an extension at the perimeter, the extension located above the first free portion and spaced apart from the first free portion, and wherein the channel is located in the extension.

2. The Power semiconductor device according to claim 1, wherein the predetermined degassing point is provided in a flange, wherein the flange connects the first electrode with a further part of the housing.

3. The Power semiconductor device according to claim 1, wherein an edging is provided for enclosing free portion.

4. The Power semiconductor device according to claim 1, wherein a gas guiding device is provided in vicinity to the predetermined degassing point.

5. The Power semiconductor device according to claim 4, wherein the gas guiding device is a polymer ring.

6. The Power semiconductor device according to claim 1, wherein the channel is formed as a path through the first electrode.

7. The Power semiconductor device according to claim 1, wherein a portion of the first electrode facing a free portion of the upper side is arranged in a two-part form.

8. The Power semiconductor device according to claim 1, wherein the power semiconductor device is a thyristor.

9. The Power semiconductor device according claim 1, wherein a portion of the electrode facing a free portion of the lower side is arranged in a two-part form.

10. The Power semiconductor device according to claim 1, wherein the power semiconductor device is a diode.

11. The Power semiconductor device according to claim 2, wherein an edging is provided for enclosing free portion.

12. The Power semiconductor device according to claim 2, wherein a gas guiding device is provided in vicinity to the predetermined degassing point.

13. The Power semiconductor device according to claim 12, wherein the gas guiding device is a polymer ring.

14. The Power semiconductor device according to claim 2, wherein the channel is formed as a path through the electrode.

15. The Power semiconductor device according to claim 2, wherein a portion of the first electrode facing a free portion of the upper side is arranged in a two-part form.

16. The Power semiconductor device according to claim 2, wherein the power semiconductor device is a thyristor.

17. The Power semiconductor device according claim 2, wherein a portion of the first electrode facing a free portion of the lower side is arranged in a two-part form.

18. The Power semiconductor device according to claim 2, wherein the power semiconductor device is a diode.

19. The Power semiconductor device according to claim 1,
wherein the predetermined degassing point is provided in a flange, wherein the flange connects the first electrode with a further part of the housing;
wherein an edging is provided for enclosing free portion;
wherein a gas guiding device is provided in vicinity to the predetermined degassing point;
wherein the gas guiding device is a polymer ring; and
wherein the channel is formed as a path through the electrode.

20. The Power semiconductor device according to claim 1,
wherein the predetermined degassing point is provided in a flange, wherein the flange connects the first electrode with a further part of the housing;
wherein a portion of the first electrode facing a free portion of the upper side is arranged in a two-part form; and
wherein the power semiconductor device is a thyristor.

* * * * *